(12) United States Patent
Stichling

(10) Patent No.: US 12,737,513 B2
(45) Date of Patent: Sep. 15, 2026

(54) METHOD AND TESTING UNIT FOR EXECUTING VIRTUAL TESTS

(71) Applicant: dSPACE GmbH, Paderborn (DE)

(72) Inventor: Dirk Stichling, Paderborn (DE)

(73) Assignee: dSPACE SE & Co. KG, Paderborn (DE)

( * ) Notice: Subject to any disclaimer, the term of this patent is extended or adjusted under 35 U.S.C. 154(b) by 954 days.

(21) Appl. No.: 18/061,489

(22) Filed: Dec. 5, 2022

(65) Prior Publication Data

US 2023/0185989 A1 Jun. 15, 2023

(30) Foreign Application Priority Data

Dec. 14, 2021 (DE) ........................ 102021132943.4
Dec. 14, 2021 (EP) .................................... 21214247

(51) Int. Cl.
*G06F 30/20* (2020.01)
*B60W 50/02* (2012.01)
*B60W 60/00* (2020.01)

(52) U.S. Cl.
CPC ......... *G06F 30/20* (2020.01); *B60W 50/0205* (2013.01); *B60W 60/001* (2020.02)

(58) Field of Classification Search
CPC .......... G06F 30/20; G06F 30/25; G06F 30/27; G06F 30/28; G06F 2111/00; G06F 2119/22; B60W 60/001; B60W 50/0205
See application file for complete search history.

(56) References Cited

U.S. PATENT DOCUMENTS 6,345,240 B1 2/2002 Havens
9,715,711 B1 * 7/2017 Konrardy ............... G06Q 40/08
9,845,096 B2 * 12/2017 Urano .................. G05D 1/0278
(Continued)

FOREIGN PATENT DOCUMENTS

JP 2000076211 A 3/2000
WO WO 2021032715 A1 2/2021

OTHER PUBLICATIONS

W. Wachenfeld, H. Winner, “Virtual Assessment of Automation in Field Operation A New Runtime Validation Method”, pp. 1-10, 2015 (Year: 2015).*
(Continued)

*Primary Examiner* — Kibrom K Gebresilassie
(74) *Attorney, Agent, or Firm* — LEYDIG, VOIT & MAYER, LTD.

(57) ABSTRACT

A method for minimizing a computational effort for executing a plurality of virtual tests includes: providing, by a testing unit, both a parameter set of a first virtual test and a parameter set of a second virtual test on driving situation parameters and configuration data of an algorithm that implements the first virtual test and the second virtual test; determining, by the testing unit, an identical component and/or a difference component of the second virtual test in relation to the first virtual test on driving situation parameters and/or a point in time at which at least one parameter of the second virtual test varies compared with the first virtual test; and executing, by the testing unit, the first virtual test and the second virtual test while taking into account the identical component and/or the difference component so as to minimize the computational effort for test execution.

10 Claims, 1 Drawing Sheet

(56) References Cited

U.S. PATENT DOCUMENTS

| | | | | |
|---|---|---|---|---|
| 2017/0371697 | A1* | 12/2017 | Eggert | G06F 11/261 |
| 2019/0179312 | A1* | 6/2019 | Kong | G05D 1/0088 |
| 2021/0141972 | A1* | 5/2021 | Aslandere | G06N 3/09 |

OTHER PUBLICATIONS

D. J. Fremont, E. Kim, Y. V. "Formal Scenario-Based Testing of Autonomous Vehicles: From Simulation to the Real World", pp. 1-8, IEEE 2020 (Year: 2020).*

Beglerovic Halil et al.: "Testing of autonomous vehicles using surrogate models and stochastic optimization", 2017 IEEE 20th International Conference on Intelligent Transportation Systems (ITSC), IEEE, Oct. 16, 2017 (Oct. 16, 2017), pp. 1-6, XP033330429, DOI: 10.1109/ITSC.2017.8317768 [retrieved on Mar. 14, 2018].

Han Youngsoo et al.: "Parametric analysis of KLT algorithm in autonomous driving", 2020 20th International Conference on Control, Automation and Systems (ICCAS), Institute of Control, Robotics, and Systems—ICROS, Oct. 13, 2020 (Oct. 13, 2020), pp. 184-189, XP033867194, DOI: 10.23919/ICCAS50221.2020.9268239 [retried on Nov. 23, 2020].

Jean Pierre Allamaa et al.: "Real-time Nonlinear MPC Strategy with Full Vehicle Validation for Autonomous Driving", arxiv.org, Cornell University Library, 201 Olin Library Cornell University Ithaca, NY 14853, Oct. 7, 2021 (Oct. 7, 2021), XP091072771.

Kexin Pei et al.: "DeepXplore : Automated Whitebox Testing of Deep Learning Systems", Proceedings of the 26th Symposium on Operating Systems Principles, SOSP '17, Jan. 1, 2017 (Jan. 1, 2017), pp. 1-18, XP055572312, New York, USA, DOI: 10.1145/3132747.3132785, ISBN: 978-1-4503-5085-3.

Chandrasekaran Jaganmohan et al.: "A Combinatorial Approach to Testing Deep Neural Network-based Autonomous Driving Systems", 2021 IEEE International Conference On Software Testing, Verification and Validation Workshops (ICSTW), IEEE, Apr. 12, 2021 (Apr. 12, 2021), pp. 57-66, XP033919926, DOI: 10.1109/ICSTW52544.2021.00022 [retrieved on May 24, 2021].

Niaz Ashfaq et al.: "Autonomous Driving Test Method Based on Digital Twin: A Survey", 2021 International Conference on Computing, Electronic and Electrical Engineering (ICE CUBE), IEEE, Oct. 26, 2021 (Oct. 26, 2021), pp. 1-7, XP034040592, DOI: 10.1109/ICECUBE53880.2021.9628341 [retrieved on Nov. 29, 2021].

* cited by examiner

METHOD AND TESTING UNIT FOR EXECUTING VIRTUAL TESTS

CROSS-REFERENCE TO PRIOR APPLICATIONS

This application claims benefit to European Patent Application No. EP 21214247.5, filed on Dec. 14, 2021, and to German Patent Application No. DE 102021132943.4, filed on Dec. 14, 2021, both of which are hereby incorporated by reference herein.

FIELD

The present invention relates to a computer-implemented method for minimizing a computational effort required for executing a plurality of virtual tests of a device for driving a motor vehicle at least partly autonomously.

The present invention further relates to a testing unit for minimizing a computational effort required for executing a plurality of virtual tests of a device for driving a motor vehicle at least partly autonomously.

BACKGROUND

Driver assistance systems such as adaptive speed regulators and/or functions for highly automated driving can be verified or validated using various test methods. In particular, simulations can be used.

To create test scenarios for simulations, test trips need to be carried out. The sensor data obtained as a result are then abstracted into a logical scenario. In this case, input data are raw data, i.e., sensor data from actual measured trips in the form of recordings of radar echoes, 3D point clouds from light detection and ranging (LiDAR) measurements and image data, or virtually generated sensor data from radar, LiDAR, ultrasonic, and/or camera sensors.

Another option for creating test scenarios is to manually and/or automatically (or semi-automatically) construct such test scenarios using corresponding testing tools.

The result data are simulatable driving scenarios that comprise both surroundings and trajectories.

In this case, the scenario-based testing method follows the approach whereby an operator creates scenarios having a predetermined number of parameters. The parameters themselves are then intended to be varied for the purpose of the simulation. Owing to the number of parameter value combinations, the result is a very large number of simulations for implementation.

JP 2000076211 A describes a device and a method for executing simulations, in which a simulation request is generated on the basis of a user input. A simulation task generator also generates a simulation task on the basis of a parameter range established by the simulation request. A decision is taken as to which processors among the accessible processors are available for executing the parallel simulation.

The simulation task is assigned to the processors on the basis of the performance and resources of each available processor. Once the simulation task has been shared out, the progress of the simulation is monitored and the simulation results obtained by the various processors are compiled.

However, the resource requirements (in particular central processing unit (CPU) and graphics processing unit (GPU) resources) for these simulations are very high. In this regard, it is irrelevant whether simulations are carried out sequentially or in parallel.

SUMMARY

In an exemplary embodiment, the present invention provides a method for minimizing a computational effort for executing a plurality of virtual tests of a device for driving a motor vehicle at least partly autonomously. The method includes: providing, by a testing unit, both a parameter set of a first virtual test and a parameter set of a second virtual test on driving situation parameters and configuration data of an algorithm that implements the first virtual test and the second virtual test; determining, by the testing unit, an identical component and/or a difference component of the second virtual test in relation to the first virtual test on driving situation parameters and/or a point in time at which at least one parameter of the second virtual test varies compared with the first virtual test, using the parameter set of the first virtual test and the parameter set of the second virtual test and the configuration data of the algorithm that implements the first virtual test and the second virtual test; and executing, by the testing unit, the first virtual test and the second virtual test while taking into account the identical component and/or the difference component of the second virtual test in relation to the first virtual test on driving situation parameters and/or the point in time at which the at least one parameter varies, so as to minimize the computational effort for test execution.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

Like reference signs designate like elements in the drawings unless indicated otherwise.

DETAILED DESCRIPTION

Figure 1:
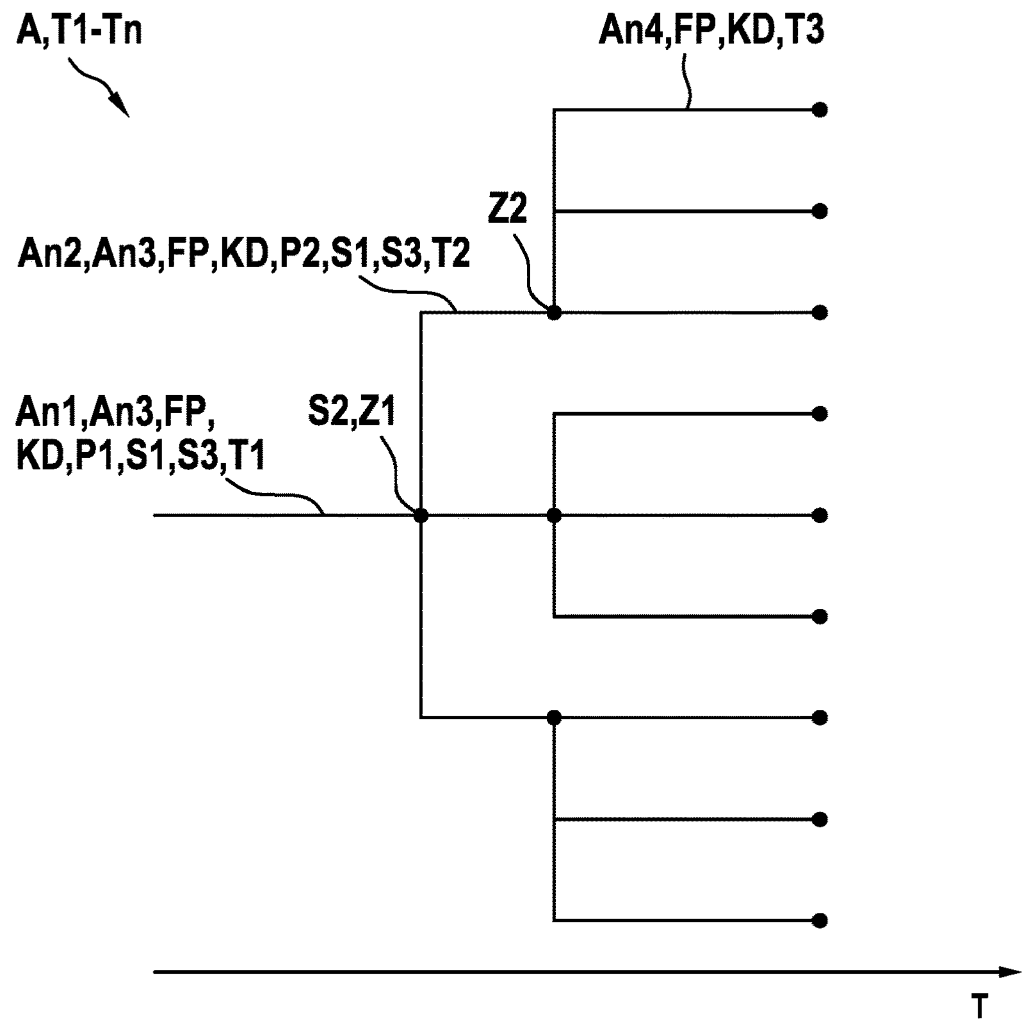
FIG. 1 is a flowchart of a computer-implemented method for minimizing a computational effort required for executing a plurality of virtual tests of a device for driving a motor vehicle at least partly autonomously, according to a preferred embodiment of the invention.

Exemplary embodiments of the present invention provide for improvements over existing methods for executing a plurality of virtual tests of a device for driving a motor vehicle at least partly autonomously with respect to the plurality of virtual tests being executable using fewer computational resources.

Exemplary embodiments of the present invention provide a more efficient method for executing the plurality of virtual tests of the device for driving a motor vehicle at least partly autonomously.

In an exemplary embodiment, the present invention provides a computer-implemented method for minimizing a computational effort required for executing a plurality of virtual tests of a device for driving a motor vehicle at least partly autonomously.

The method comprises providing both a parameter set of a first virtual test and of a second virtual test on driving situation parameters and configuration data of an algorithm that implements the first virtual test and the second virtual test.

The parameter set may comprise raw data, i.e., sensor data from actual measured trips in the form of recordings of radar echoes, 3D point clouds from LiDAR measurements and image data, or virtually generated sensor data from radar, LiDAR, ultrasonic, and/or camera sensors.

Alternatively, the parameter set of driving situation parameters may include, for example, sensor data generated artificially or synthetically and manually and/or (semi-) automatically using corresponding testing tools of a test environment.

The method further comprises determining an identical component and/or a difference component of the second virtual test in relation to the first virtual test on driving situation parameters and/or a point in time at which at least one parameter of the second virtual test varies compared with the first virtual test, using the parameter set of the first virtual test and of the second virtual test and the configuration data of the algorithm that implements the first virtual test and the second virtual test.

In addition, the method comprises executing the first virtual test and the second virtual test while taking into account the identical component and/or the difference component of the second virtual test in relation to the first virtual test on driving situation parameters and/or the point in time at which at least one parameter varies, so as to minimize the computational effort required for the test execution.

The invention further relates to a testing unit for minimizing a computational effort required for executing a plurality of virtual tests of a device for driving a motor vehicle at least partly autonomously. The testing unit may include, for example, one or more non-transitory computer-readable mediums (or one or more memories) having processor-executable instructions stored thereon and at least one processor configured to execute the processor-executable instructions to implement a method in accordance with an exemplary embodiment of the invention.

The testing unit is configured to provide both a parameter set of a first virtual test and of a second virtual test on driving situation parameters and configuration data of an algorithm that implements the first virtual test and the second virtual test.

The testing unit furthermore is configured to determine an identical component and/or a difference component of the second virtual test in relation to the first virtual test on driving situation parameters and/or a point in time at which at least one parameter of the second virtual test varies compared with the first virtual test, using the parameter set of the first virtual test and of the second virtual test and the configuration data of the algorithm that implements the first virtual test and the second virtual test.

In addition, the testing unit is configured to execute the first virtual test and the second virtual test while taking into account the identical component and/or the difference component of the second virtual test in relation to the first virtual test on driving situation parameters and/or the point in time at which at least one parameter varies, so as to minimize the computational effort required for the test execution.

Exemplary embodiments of the invention may reduce resource consumption when implementing virtual tests in scenario-based testing in such a way that simulations which proceed identically up to a certain point in time are only implemented once. In scenario-based testing, one scenario is generally simulated using different parameter settings in parallel.

Therefore, it is likely that a subset of the simulations proceed identically up to a certain point in time.

Accordingly, if it is known that a specific parameter does not affect the simulation until after a particular simulation time, it is sufficient initially to execute just one simulation up to that point in time. From that point in time onward, the simulation is then divided according to the number of parameter variations.

If another parameter becomes relevant at a later time in the simulation, then the simulations are accordingly divided again at that point.

If the simulation times at which the parameters affect the simulation are already known before the simulation, a plan can be drawn up beforehand for when the simulations will be divided into further sub-simulations. An estimation of the resource requirements can thus be prepared beforehand, for example.

If the simulation times at which the parameters affect the simulation are only produced during the runtime, then the simulation can also be divided dynamically at the relevant point in time.

For this purpose, during the simulation, a particular simulation time at which one or more parameters affect the simulation can be calculated, and so the current simulation, or a current simulation path, can be divided into further sub-simulations at that simulation time.

Further embodiments of the present invention are set out in the description below, with reference to the drawings.

According to an exemplary embodiment of the invention, the first virtual test and the difference component of the second virtual test in relation to the first virtual test on driving situation parameters are executed to minimize the computational effort required for the test execution. Advantageously, therefore, the computational effort required for the test execution can be reduced.

According to another exemplary embodiment of the invention, the difference component of the second virtual test in relation to the first virtual test on driving situation parameters is executed from the point in time at which the at least one parameter varies. Therefore, the difference component of the second virtual test runs immediately after the shared component in relation to the first test.

According to another exemplary embodiment of the invention, the difference component of the second virtual test in relation to the first virtual test on driving situation parameters chronologically follows the identical component of the second virtual test in relation to the first virtual test on driving situation parameters.

This may thus make it possible for tests on difference components in relation to identical components of virtual tests to be executed efficiently and partly in parallel.

According to another exemplary embodiment of the invention, the first virtual test and the difference component of the second virtual test in relation to the first virtual test on driving situation parameters are executed sequentially.

Advantageously, therefore, it is possible to avoid certain simulation components being computed or simulated multiple times.

In this context, the term “sequential” should be construed to mean that the first virtual test and the difference component of the second virtual test in relation to the first virtual test on driving situation parameters are executed either one immediately after the other or one after the other following a delay, which is determined as a result of the computation of the difference component of the second virtual test.

According to another exemplary embodiment of the invention, the parameter set of the first virtual test on driving situation parameters and the configuration data of the algorithm that executes the first virtual test are duplicated, in order to generate the parameter set of the second virtual test on driving situation parameters at the point in time at which the at least one parameter varies, and are varied on account of the at least one parameter.

The second virtual test can thus be implemented by building on the first virtual test, in each case using predetermined or specifically altered parameters.

According to another exemplary embodiment of the invention, the first virtual test is executed on a first computing node, wherein, once the parameter set of the first virtual test on driving situation parameters and the configuration data of the algorithm that executes the first virtual test have been duplicated in order to generate the parameter set of the second virtual test on driving situation parameters, the second virtual test is executed on the first computing node or on a second computing node.

Therefore, when two or more computing nodes are used, a CPU and/or GPU workload can advantageously be shared out across a plurality of computing nodes.

According to another exemplary embodiment of the invention, the configuration data of the algorithm that implements the first virtual test and the second virtual test comprise value ranges, which are to be tested, of driving situation parameters, a step size of the driving situation parameters to be tested, which in particular is either predetermined or parameterizable by the algorithm, and/or a number of simulations per iteration.

As a result, both a possible number of parameter variations of a virtual test and a computational effort required for a particular iteration can be determined, for example.

According to another exemplary embodiment of the invention, the parameter set of the second virtual test on driving situation parameters is provided before or during the execution of the first virtual test.

Advantageously, therefore, the parameter set of the second virtual test can be computed while the first virtual test is being implemented, thereby allowing the entire test to be implemented in a time-efficient manner.

According to another exemplary embodiment of the invention, the identical component and/or the difference component of the second virtual test in relation to the first virtual test on driving situation parameters and/or the point in time at which the at least one parameter of the second virtual test varies compared with the first virtual test is/are determined before or during the implementation of the first virtual test.

Therefore, the first and second virtual tests can be implemented efficiently without the need for any buffering or pausing of the second virtual test before it is executed.

According to another exemplary embodiment of the invention, a parameter set of a third virtual test on driving situation parameters and configuration data of an algorithm that implements the third virtual test are provided, and wherein an identical component and/or a difference component of the third virtual test in relation to the second virtual test on driving situation parameters and/or a point in time at which at least one parameter of the third virtual test varies compared with the second virtual test is/are determined.

Therefore, by executing only the difference component of the third virtual test, resource consumption when implementing the scenario-based testing can be reduced.

According to another exemplary embodiment of the invention, the first virtual test and each further virtual test are executed in a cloud environment. Advantageously, this allows computing resources to be allocated flexibly according to particular requirements of the virtual test.

According to another exemplary embodiment of the invention, the identical component and/or the difference component of the second virtual test in relation to the first virtual test on driving situation parameters and/or the point in time at which the at least one parameter of the second virtual test varies compared with the first virtual test is/are determined by analyzing the algorithm that simulates the parameter set or by establishing beforehand the point in time at which the at least one parameter of the second virtual test varies compared with the first virtual test.

Advantageously, therefore, it is possible to compute or specify a chronological sequence of the first and/or second virtual test as well as a parameter variation of the second virtual test compared with the first virtual test.

The features described herein of the computer-implemented method for minimizing a computational effort required for executing a plurality of virtual tests of a device for driving a motor vehicle at least partly autonomously apply likewise to the testing unit for minimizing a computational effort required for executing a plurality of virtual tests of a device for driving a motor vehicle at least partly autonomously, and vice versa.

The method shown in FIG. 1 comprises providing S1 both a parameter set P1, P2 of a first virtual test T1 and of a second virtual test T2 on driving situation parameters FP and configuration data KD of an algorithm A that implements the first virtual test T1 and the second virtual test T2.

The method further comprises determining S2 an identical component An1 and/or a difference component An2 of the second virtual test T2 in relation to the first virtual test T1 on driving situation parameters FP and/or a point in time Z1 at which at least one parameter of the second virtual test T2 varies compared with the first virtual test T1, using the parameter set P1, P2 of the first virtual test T1 and of the second virtual test T2 and the configuration data KD of the algorithm A that implements the first virtual test T1 and the second virtual test T2.

In addition, the method comprises executing S3 the first virtual test T1 and the second virtual test T2 for a time period T while taking into account the identical component An1 and/or the difference component An2 of the second virtual test T2 in relation to the first virtual test T1 on driving situation parameters FP and/or the point in time Z1 at which at least one parameter varies, so as to minimize the computational effort required for the test execution.

The first virtual test T1 and the difference component An2 of the second virtual test T2 in relation to the first virtual test T1 on driving situation parameters FP are executed to minimize the computational effort required for the test execution.

In the process, the difference component An2 of the second virtual test T2 in relation to the first virtual test T1 on driving situation parameters FP is executed from the point in time Z1 at which the at least one parameter varies.

The difference component An2 of the second virtual test T2 in relation to the first virtual test T1 on driving situation parameters FP chronologically follows the identical component An1 of the second virtual test T2 in relation to the first virtual test T1 on driving situation parameters FP.

In particular, the first virtual test T1 and the difference component An2 of the second virtual test T2 in relation to the first virtual test T1 on driving situation parameters FP are executed sequentially.

The parameter set P1 of the first virtual test T1 on driving situation parameters FP and the configuration data KD of the algorithm that executes the first virtual test T1 are duplicated, in order to generate the parameter set P2 of the second virtual test T2 on driving situation parameters FP at the point in time Z1 at which the at least one parameter varies, and are varied on account of the at least one parameter.

The first virtual test T1 is executed on a first computing node R1. Once the parameter set P1 of the first virtual test T1 on driving situation parameters FP and the configuration data KD of the algorithm A that executes the first virtual test T1 have been duplicated in order to generate the parameter set P2 of the second virtual test T2 on driving situation parameters FP, the second virtual test T2 is executed on the first computing node or on a second computing node R2.

The configuration data KD of the algorithm A that implements the first virtual test T1 and the second virtual test T2 comprise value ranges, which are to be tested, of driving situation parameters FP, a step size of the driving situation parameters FP to be tested, which in particular is either predetermined or parameterizable by the algorithm A, and/or a number of simulations per iteration.

The parameter set P2 of the second virtual test T2 on driving situation parameters FP is provided before or during the execution of the first virtual test T1.

The identical component An1 and/or the difference component An2 of the second virtual test T2 in relation to the first virtual test T1 on driving situation parameters FP and/or the point in time Z1 at which the at least one parameter of the second virtual test T2 varies compared with the first virtual test T1 is/are determined before or during the implementation of the first virtual test T1.

A parameter set P3 of a third virtual test T3 on driving situation parameters FP and configuration data KD of an algorithm A that implements the first virtual test T3 are provided.

An identical component An3 and/or a difference component An4 of the third virtual test T3 in relation to the second virtual test T2 on driving situation parameters FP and/or a point in time Z2 at which at least one parameter of the third virtual test T3 varies compared with the second virtual test T2 is/are determined. In the process, the first virtual test T1 and each further virtual test are executed in a cloud environment.

By way of example, FIG. 1 shows further branches in the method sequence, which indicate the execution of further virtual tests using driving situation parameters FP that have been altered at particular points in time and/or configuration data KD of the algorithm A that implements the test in question.

The identical component An1 and/or the difference component An2 of the second virtual test T2 in relation to the first virtual test T1 on driving situation parameters FP and/or the point in time Z1 at which the at least one parameter of the second virtual test T2 varies compared with the first virtual test T1 is/are determined by analyzing the algorithm A that simulates the parameter set P1, P2 or by establishing beforehand the point in time Z1 at which the at least one parameter of the second virtual test T2 varies compared with the first virtual test T1.

Figure 2:
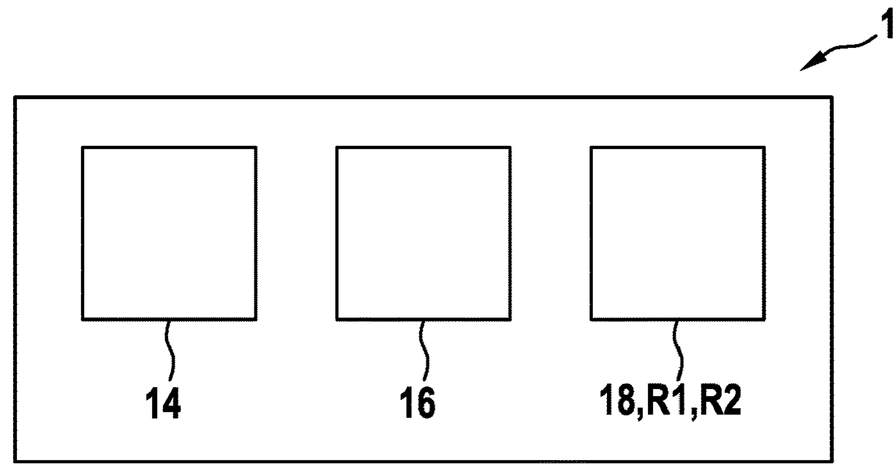
FIG. 2 is a schematic illustration of a testing unit for minimizing a computational effort required for executing a plurality of virtual tests of a device for driving a motor vehicle at least partly autonomously, according to a preferred embodiment of the invention.

FIG. 2 is a schematic illustration of a testing unit for minimizing a computational effort required for executing a plurality of virtual tests of a device for driving a motor vehicle at least partly autonomously, according to the preferred embodiment of the invention.

The testing unit 1 has functionality 14 for providing S1 both a parameter set P1 of a first virtual test T1 and of a second virtual test T2 on driving situation parameters FP and configuration data KD of an algorithm A that implements the first virtual test T1 and the second virtual test T2.

Furthermore, the testing unit 1 has functionality 16 for determining S2 an identical component An1 and/or a difference component An2 of the second virtual test T2 in relation to the first virtual test T1 on driving situation parameters FP and/or a point in time Z1 at which at least one parameter of the second virtual test T2 varies compared with the first virtual test T1, using the parameter set P1, P2 of the first virtual test T1 and of the second virtual test T2 and the configuration data KD of the algorithm A that implements the first virtual test T1 and the second virtual test T2.

In addition, the testing unit 1 has functionality 18 for executing S3 the first virtual test T1 and the second virtual test T2 while taking into account the identical component An1 and/or the difference component An2 of the second virtual test T2 in relation to the first virtual test T1 on driving situation parameters FP and/or the point in time Z1 at which at least one parameter varies, so as to minimize the computational effort required for the test execution.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Testing unit
14 Functionality
16 Functionality
18 Functionality
A Algorithm
An1, An3 Identical component
An2, An4 Difference component
FP Driving situation parameters
KD Configuration data P1, P2 Parameter set
R1 First computing node
R2 Second computing node
T Time period
S1-S3 Method steps
T1-Tn Virtual tests
T1 First virtual test
T2 Second virtual test
T3 Third virtual test
Z1, Z2 Point in time

The invention claimed is:

1. A method for minimizing a computational effort for executing a plurality of virtual tests of a device for driving a motor vehicle at least partly autonomously, comprising:

obtaining, by a testing device, a first parameter set of a first virtual test and a second parameter set of a second virtual test on driving situation parameters and configuration data for implementing the first virtual test and the second virtual test;

determining, by the testing device, based on the first parameter set. the second parameter set, and the configuration data, a first component of the first and second virtual tests that is identical, a second component of the second virtual test that is different from a second component of the first virtual test, and a point in time at which at least one parameter of the second virtual test varies compared with the first virtual test; and executing, by the testing device, the first virtual test and the second virtual test, wherein executing the first virtual test and the second virtual test comprises:

prior to the determined point in time, executing the first virtual test and not the second virtual test; and after the determined point in time, executing both the first virtual test and the second virtual test in parallel, wherein execution of the second virtual test after the determined point in time utilizes parameters obtained from the execution of the first virtual test prior to the determined point in time.

2. The method according to claim 1, wherein the parameters obtained from the execution of the first virtual test prior to the determined point in time are duplicated for us in the second virtual test.

3. The method according to claim 1, wherein the configuration data comprise value ranges of driving situation parameters to be tested, a step size of the driving situation parameters to be tested, and/or a number of simulations per iteration.

4. The method according to claim 1, wherein the determination is performed before or during the execution of the first virtual test.

5. The method according to claim 1, further comprising:

obtaining a third parameter set of a third virtual test on driving situation parameters and configuration data for implementing the third virtual test; and determining a third component of the second and third virtual tests that is identical, a fourth component of the second virtual test that is different from a fourth component of the third virtual test, and a point in time at which at least one parameter of the third virtual test varies compared with the second virtual test.

6. The method according to claim 1, wherein the first virtual test and the second virtual test are executed in a cloud environment.

7. The method according to claim 1, wherein the determination is based on analyzing an algorithm that simulates the parameter set or establishing beforehand the point in time at which the at least one parameter of the second virtual test varies compared with the first virtual test.

8. The method according to claim 2, wherein the first virtual test is executed on a first computing node, and the second virtual test is executed on a second computing node.

9. A testing device for minimizing a computational effort for executing a plurality of virtual tests of a device for driving a motor vehicle at least partly autonomously, comprising:

one or more memories having processor-executable instructions stored thereon; and at least one processor configured to execute the processor-executable instructions to facilitate the following being performed by the testing unit:

obtaining a first parameter set of a first virtual test and a second parameter set of a second virtual test on driving situation parameters and configuration data for implementing the first virtual test and the second virtual test;

determining based on the first parameter set, the second parameter set. and the configuration data, a first component of the first and second virtual tests that is identical, a second component of the second virtual test that is different from a second component of the first virtual test, and a point in time at which at least one parameter of the second virtual test varies compared with the first virtual test; and executing the first virtual test and the second virtual test, wherein executing the first virtual test and the second virtual test comprises:

prior to the determined point in time, executing the first virtual test and not the second virtual test; and after the determined point in time, executing both the first virtual test and the second virtual test in parallel, wherein execution of the second virtual test after the determined point in time utilizes parameters obtained from the execution of the first virtual test prior to the determined point in time.

10. One or more non-transitory computer-readable mediums having processor-executable instructions stored thereon for minimizing a computational effort for executing a plurality of virtual tests of a device for driving a motor vehicle at least partly autonomously, wherein the processor-executable instructions, when executed, facilitate performance of the following:

obtaining a first parameter set of a first virtual test and a second parameter set of a second virtual test on driving situation parameters and configuration data for implementing the first virtual test and the second virtual test;

determining based on the first parameter set, the second parameter set, and the configuration data, a first component of the first and second virtual tests that is identical, a second component of the second virtual test that is different from a second component of the first virtual test, and a point in time at which at least one parameter of the second virtual test varies compared with the first virtual test; and executing the first virtual test and the second virtual test, wherein executing the first virtual test and the second virtual test comprises:

prior to the determined point in time, executing the first virtual test and not the second virtual test; and after the determined point in time, executing both the first virtual test and the second virtual test in parallel, wherein execution of the second virtual test after the determined point in time utilizes parameters obtained from the execution of the first virtual test prior to the determined point in time.

* * * * *